(12) United States Patent
Sakaida et al.

(10) Patent No.: US 7,036,916 B2
(45) Date of Patent: May 2, 2006

(54) INK-JET HEAD SYSTEM

(75) Inventors: Atsuo Sakaida, Gifu (JP); Tetsuaki Sugahara, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 77 days.

(21) Appl. No.: 10/668,501

(22) Filed: Sep. 24, 2003

(65) Prior Publication Data
US 2004/0125177 A1 Jul. 1, 2004

(30) Foreign Application Priority Data
Sep. 24, 2002 (JP) .............................. 2002-277331

(51) Int. Cl.
*B41J 2/045* (2006.01)
*B41J 2/14* (2006.01)

(52) U.S. Cl. .............................. 347/68; 347/71; 347/50

(58) Field of Classification Search .................. 347/44, 347/47, 49, 50, 54, 57, 58, 63, 68–72; 439/38–40, 439/74
See application file for complete search history.

(56) References Cited

U.S. PATENT DOCUMENTS 4,633,274 A * 12/1986 Matsuda ...................... 347/50
6,129,559 A * 10/2000 Hirata et al. ................... 439/74
6,419,348 B1 7/2002 Kojima et al.
6,523,940 B1 * 2/2003 Scheffelin et al. ............. 347/50
6,817,698 B1 * 11/2004 Verlinden et al. ............. 347/47
6,854,985 B1 * 2/2005 Weiss .......................... 439/91
2004/0077187 A1 * 4/2004 Belongia et al. .............. 439/39

FOREIGN PATENT DOCUMENTS

JP 2732630 B2 12/1997
JP 2000-127384 A 5/2000

* cited by examiner

*Primary Examiner*—Manish Shah
*Assistant Examiner*—Geoffrey Mruk
(74) *Attorney, Agent, or Firm*—Oliff & Berridge, PLC.

(57) ABSTRACT

An inkjet head system has an inkjet head and a printed board connected to the inkjet head. The inkjet head includes a cavity plate formed with a plurality of ink pressure chambers arranged adjacent to each other. A piezoelectric actuator is placed on the cavity plate. A plurality of driving electrodes is formed on the piezoelectric actuator at positions corresponding to respective ones of the plurality of ink pressure chambers. The printed board includes a plurality of electrode lands connected with respective ones of the plurality of driving electrodes to supply driving signals thereto. The electrode lands are connected with respective ones of the plurality of driving elements by means of magnetic force. Therefore, the printed board can be easily detached from the inkjet head by pulling it from the inkjet head against the magnetic force.

20 Claims, 5 Drawing Sheets

INK-JET HEAD SYSTEM

BACKGROUND OF THE INVENTION

1. Field of Invention

The present invention relates to an inkjet head system in which an inkjet head is connected with a flexible printed board in an improved manner.

2. Description of Related Art

A line type inkjet head is disclosed in Japanese patent application provisional publication No. P2000-127384. The disclosed inkjet head has a cavity plate formed with a plurality of ink pressure chambers arranged at regular intervals. Ink for printing is stored in each of the ink pressure chambers. A piezoelectric element is attached on the cavity plate, which is configured to selectively apply pressure to each of the ink pressure chambers. The piezoelectric element is connected with a flexible printed board and actuates in accordance with driving signals provided therefrom. In this manner, ink can be ejected from desired nozzles of the inkjet head.

The inkjet head mentioned above is connected with the flexible printed board by means of soldering. Accordingly, if one of the inkjet head and the flexible printed board has a defect, both of them have been discarded although one is still usable.

Recently, the number of nozzles of the line type inkjet head is increasing due to the demand for high resolution printing. Inkjet heads with a large number of nozzles tend to have defects such as nozzle clogging. Thus the yield rate of such inkjet heads is relatively low, and hence the problem mentioned above is serious for such inkjet heads.

Therefore, there is a need for an inkjet head and a flexible printed board that allow reuse of one of them when a defect is found in the other one even after the inkjet head and the flexible printed board are once connected to each other.

SUMMARY OF THE INVENTION

The present invention is advantageous in that an inkjet head system including an inkjet head and a printed board to be connected to the inkjet head is provided that satisfy the above-mentioned need.

According to an aspect of the invention, an inkjet head system having an inkjet head and a printed board connected to the inkjet head is provided.

The inkjet head includes a cavity plate formed with a plurality of ink pressure chambers arranged adjacent to each other. A piezoelectric actuator is placed on the cavity plate. A plurality of driving electrodes is formed on the piezoelectric actuator at positions corresponding to respective ones of the plurality of ink pressure chambers.

The printed board includes a plurality of electrode lands connected with respective ones of the plurality of driving electrodes to supply driving signals thereto. The electrode lands are connected with respective ones of the plurality of driving elements by means of magnetic force. Therefore, the printed board can be easily detached from the inkjet head by pulling it from the inkjet head against the magnetic force.

The inkjet head system mentioned above can be obtained, for example, by providing on the electrode lands and the driving electrodes first and second conductive layers, respectively. One of the first and second conductive layers may include permanently magnetized magnetic material, while the other one may include magnetic material not magnetized.

The permanently magnetized magnetic material may be provided in the form of powder. The magnetic material not magnetized may be iron, and may be provided in the form of powder, too.

Alternatively, the inkjet head system mentioned above can also be obtained by providing on the electrode lands and the driving electrodes first and second conductive layers, each including permanently magnetized magnetic material.

Optionally, each of the first and second conductive layers may be made of thermosetting resin including magnetic material.

Optionally or additionally, each of the first and second conductive layers may be made of an adhesive agent including magnetic material.

According to another aspect of the invention, an inkjet head is provided that includes a terminal to be connected with an external power line to receive power for driving the inkjet head. The terminal is provided with magnetic material that allows the terminal being detachably connected with the external power line by means of magnetic force. Accordingly, the inkjet head can be detached from the external power line whenever it is desired to be used in combination with another power line.

Optionally, the magnetic material may be permanently magnetized.

Alternatively, the magnetic material may be ferromagnetic material, such as iron, which is not magnetized.

Optionally, the magnetic material is provided on the terminal by forming a layer of thermosetting resin including the magnetic material. Further, the magnetic material may optionally be mixed into the resin in a form of powder.

Optionally or additionally, the magnetic material is provided on the terminal by forming a layer of adhesive agent including the magnetic material.

According to yet another aspect of the invention, a flexible printed board for use in combination with an inkjet head having terminals including magnetic material is provided. The flexible printed board includes an electrode land to be connected with the terminal of the inkjet head to provide power thereto. A conductive layer is also formed on the electrode land, and further includes a magnetic material that allows the conductive layer and the terminal of the inkjet head to attract and establish a connection with each other due to the magnetic force acting therebetween.

Optionally, the magnetic material may be permanently magnetized.

Alternatively, the magnetic material may be ferromagnetic material that is not magnetized.

Optionally, the conductive layer may be made of thermosetting resin including the magnetic material, for example, in a form of powder.

Optionally or additionally, the conductive layer is made of an adhesive agent that includes the magnetic material.

BRIEF DESCRIPTION OF THE DRAWINGS

This invention will be described with reference to the drawings, in which.

DETAILED DESCRIPTION OF PREFERRED EMBODIMENTS

Hereinafter, an inkjet head system according to an embodiment of the invention will be described with reference to the accompanied embodiment.

Figure 1:
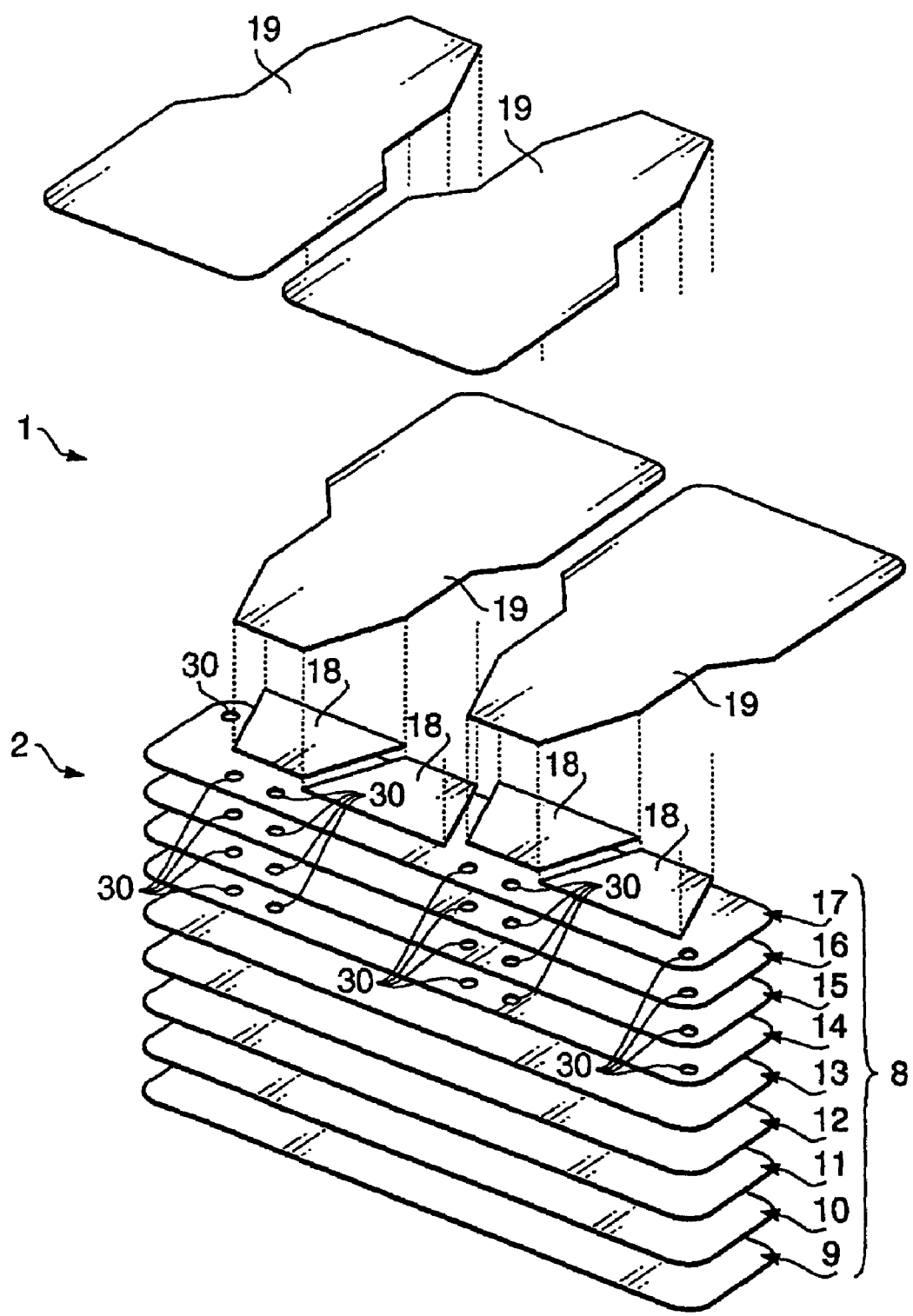
FIG. 1 is an exploded perspective view of an inkjet head system according to a preferred embodiment.

FIG. 1 is an exploded perspective view of the inkjet head system 1 according to a preferred embodiment. The inkjet head system 1 includes an inkjet head 2 and four flexible printed boards 19. The inkjet head 2 further includes a head body 8 and four trapezoidal piezoelectric actuators 18.

The head body 8 has a laminated structure in which nine substantially rectangular thin metal plates are stacked. More specifically, the nine plates are a nozzle plate 9, a cover plate 10, first, second and third manifold plates 11, 12 and 13, a supply plate 14, an aperture plate 15, a base plate 16, and a cavity plate 17 in this order from the bottom of the head body 8. The nine plates are adhered with each other by an adhesive agent.

The four trapezoidal piezoelectric actuators 18 are attached on the top face of the cavity plate 17 by an adhesive agent. Each of the piezoelectric actuators 18 is connected with a tip portion of one of the four flexible printed boards 19 in a manner that will be described in detail later. Each flexible printed board 19 is provided with an integrated circuit (IC) (not shown) for driving the corresponding piezoelectric actuator 18.

Figure 2:
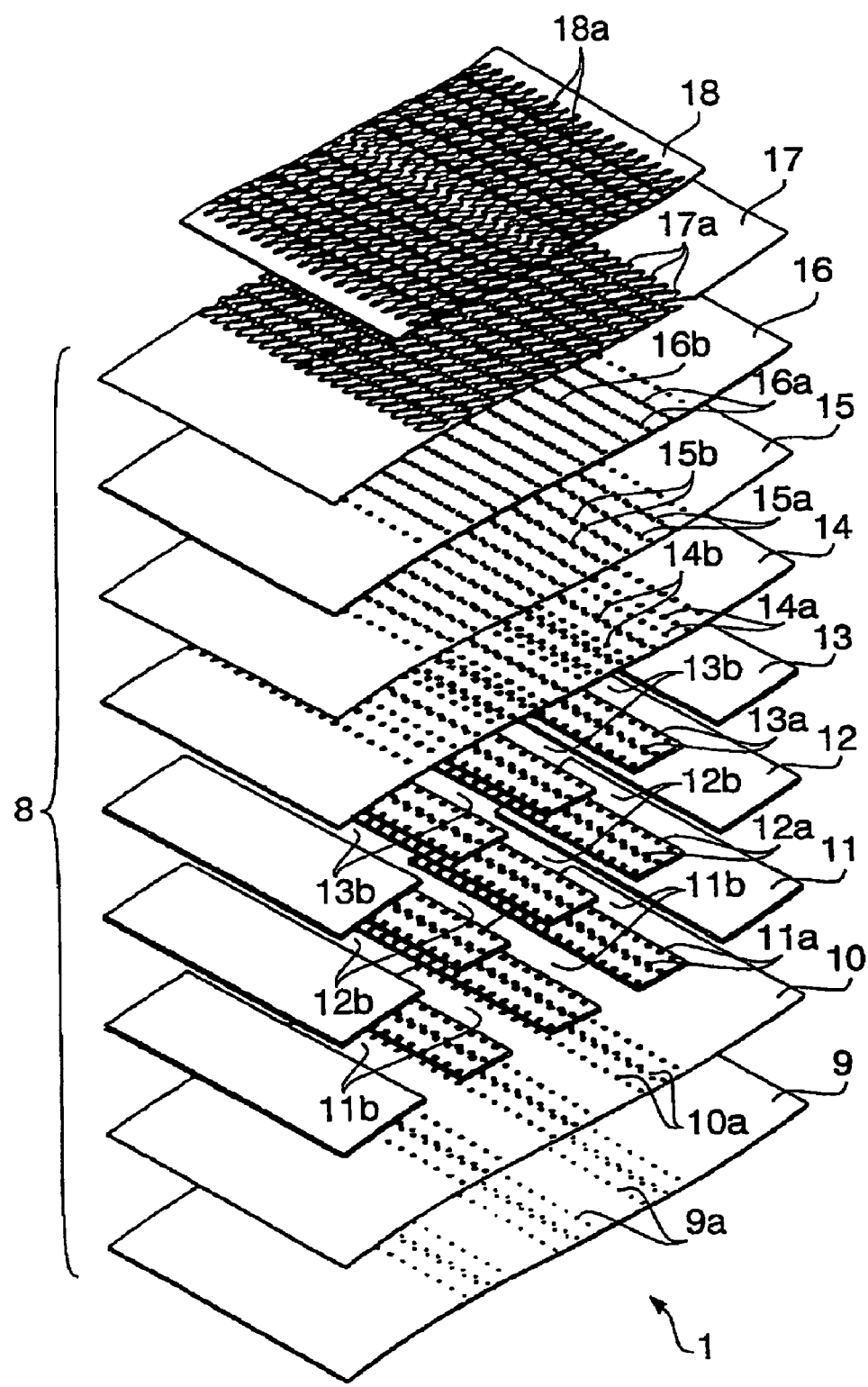
FIG. 2 is an exploded perspective view of a part of a head body and a piezoelectric actuator of an inkjet head of the inkjet head system shown in FIG. 1.
Figure 3:
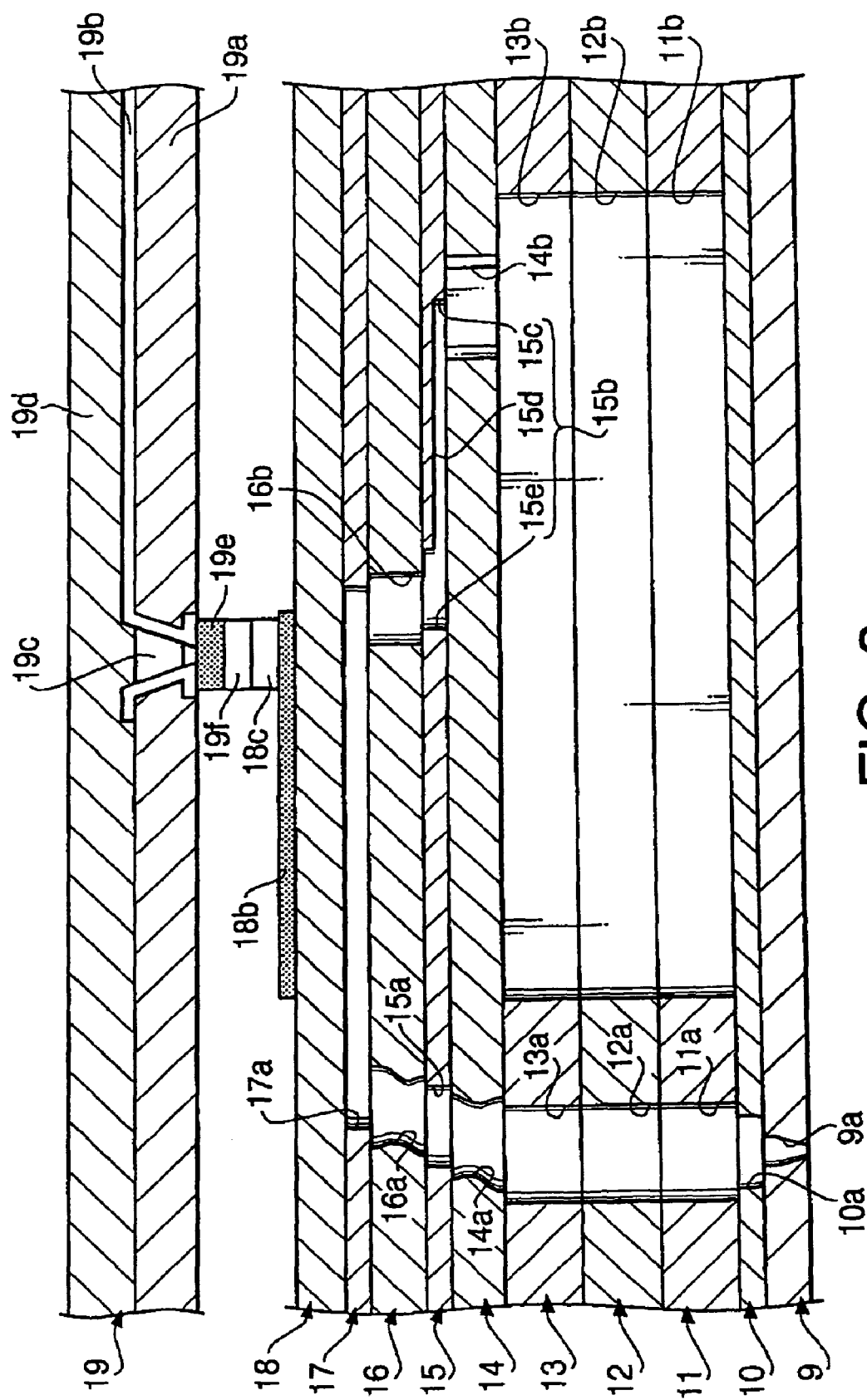
FIG. 3 is an enlarged sectional view of a part of the head body and the piezoelectric actuator shown in FIG. 3.

FIG. 2 is an exploded perspective view of a part of the head body 8 and the piezoelectric actuator 18, and FIG. 3 is an enlarged sectional view of a part of the head body 8 and the piezoelectric actuator 18.

As shown in FIGS. 2 and 3, the nozzle plate 9 is formed with a plurality of fine diameter nozzles 9a through which ink is to be ejected. The nozzles 9a are formed at a pitch corresponding to a printing resolution of about 600 dpi.

The cover plate 10 is formed with a plurality of fine diameter through holes 10a. The through holes 10a serve as ink channels being in fluid communication with respective ones of the nozzles 9a.

The first manifold plate 11 is formed with a plurality of through holes 11a. The through holes 11a are in fluid communication with respective ones of the through holes 10a and serve as fine diameter ink channels. The first manifold plate 11 is also formed with a plurality of elongated openings 11b extending in the longitudinal direction of the substantially rectangular manifold plate 11.

The second manifold plate 12 is formed with a plurality of through holes 12a, which are in fluid communication with respective ones of the through holes 11a to serve as fine diameter ink channels. The second manifold plate 12 is further provided with elongated openings 12b extending in the longitudinal direction of the second manifold plate 12. The openings 12b are formed at positions corresponding to the openings 11b of the first manifold plate 11.

Further, the third manifold plate 13 is formed with a plurality of through holes 13a which are in fluid communication with respective ones of the through holes 12a of the second manifold plate 12 to serve as fine diameter ink channels. The third manifold plate 12 is also provided with elongated openings 13b extending in the longitudinal direction of the third manifold plate 13. The openings 13b are formed at positions corresponding to the openings 12b of the second manifold plate 11.

The openings 11b, 12b, and 13b of the first, second, and third manifold plates 11, 12 and 13 constitute a plurality of manifolds MN within the head body 8. The manifolds MN are to be filled with ink supplied through ink channels consisting of through holes 30 formed in the cavity plate 17, the base plate 16, the aperture plate 15, and the supply plate 14 as shown in FIG. 1. The depth and width of each manifold MN is determined so that each manifold MN can reserve a predetermined amount of ink.

The supply plate 14 is formed with a plurality of through holes 14a, which are in fluid communication with respective ones of the through holes 13a of the third manifold plate 13 to serve as fine diameter ink channels. The supply plate 14 is also provided with a plurality of through holes 14b formed at positions above the opening 13b of the third manifold plate 13.

The aperture plate 15 is formed with a plurality of through holes 15a, which are in fluid communication with respective ones of the through holes 14a of the supply plate 14 to serve as fine diameter ink channels. The aperture plate 15 is also provided with a plurality of ink flow regulating channels 15b at positions corresponding to the through holes 14b of the supply plate 14.

The base plate 16 is formed with a plurality of through holes 16a, which are in fluid communication with respective ones of the through holes 15a of the aperture plate 15. The base plate 16 is further provided with a plurality of through holes 16b, which are in fluid communication with respective ones of the ink flow regulating channels 15b.

The cavity plate 17 is formed with a plurality of ink pressure chambers 17a arranged in matrix.

Figure 4:
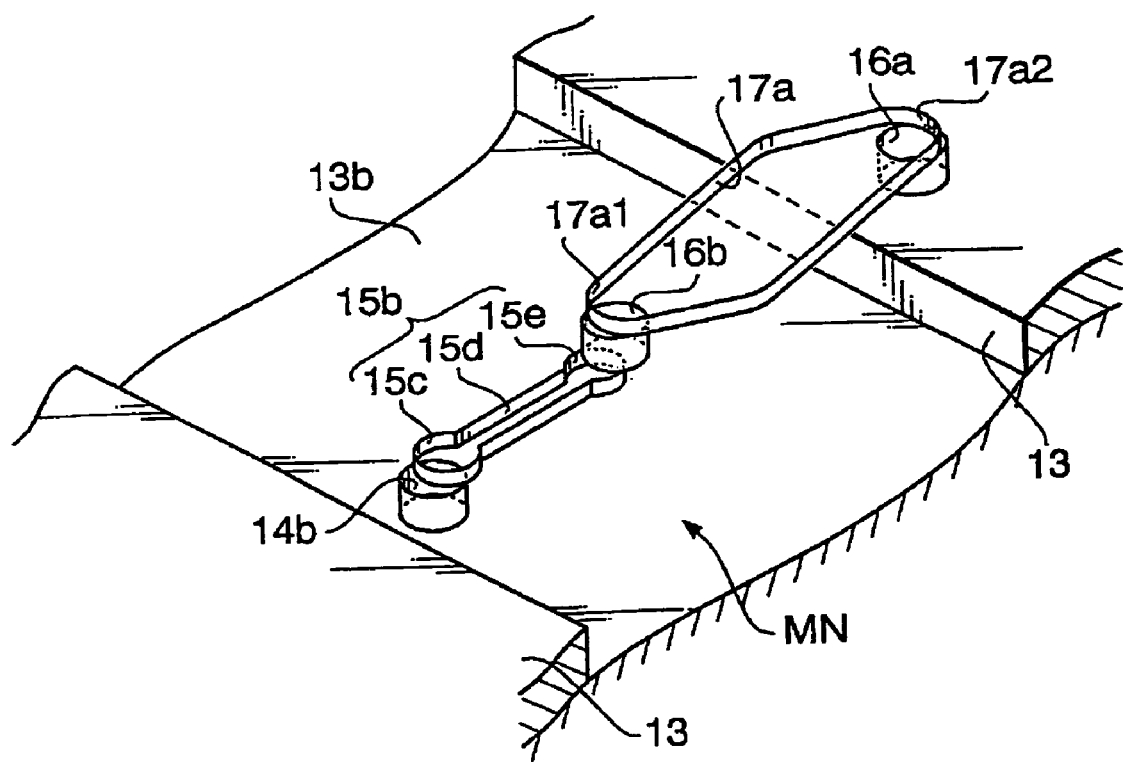
FIG. 4 is a perspective view that schematically shows an ink pressure chamber and an ink channel connected thereto of the inkjet head of the inkjet head system shown in FIG. 1.

FIG. 4 is a perspective view that schematically shows one of the ink pressure chambers 17a and the ink channels 15b connected thereto. Each of the ink pressure chambers 17a is formed in a substantially rhombic shape having first and second acute angle corners 17a1 and 17a2.

Referring to FIGS. 3 and 4, the first acute angle corner 17a1 is in fluid communication with one of the through holes 16b to introduce ink into the ink pressure chamber 17a. The second acute angle corner 17a2 is in fluid communication with one of the through hole 16a to discharge ink to the corresponding nozzle 9a.

As shown in FIG. 2, the ink pressure chambers 17a are arranged in matrix such that the acute angle corners of one ink pressure chamber 17a is located between acute angle corners of two other adjoining ink pressure chambers 17a, which allows the substantially rhombic ink pressure chambers to be arranged at high density.

Referring back to FIGS. 3 and 4, each of the ink flow regulating channels 15b formed to the aperture plate 15 includes a round recess 15c, an elongated groove 15d extending from the round recess 15c, and a through hole 15e formed at the end of the elongated groove 15d opposite to round recess 15c. As shown in FIG. 3, the round recess 15c and the elongated groove 15d are formed on the aperture plate 15 at the side facing the supply plate 14. Since the elongated groove 15d has a relatively small section, the channel resistance thereof is relatively large and the rate of ink flowing into the ink pressure chamber is restricted by the elongated groove 15d.

As shown in FIG. 1, the piezoelectric actuators 18 are attached on the top face of the cavity plate 17 by an adhesive agent. Each piezoelectric actuator 18 is a laminate of four piezoelectric sheets (not shown). A plurality of surface electrodes, or driving electrodes 18b (see FIG. 3), is formed on the top face of the uppermost piezoelectric sheet. Further, inner electrodes (not shown) are formed between first and second piezoelectric sheets, and between third and fourth piezoelectric sheets.

The driving electrodes 18b are formed at positions corresponding to (above) respective ones of the ink pressure chambers 17a, in a size slightly smaller than the ink pressure chambers 17a. A piezoelectric unit structure 18a (see FIG. 2) is defined in the piezoelectric sheets below each of the driving electrodes 18b, which piezoelectric unit structure 18a has a rhombic form similar to that of the ink pressure chamber 17a.

The driving electrodes 18b are electrically connected with respective electrode lands 19e formed on the flexible circuit board 19 in a manner that will be described in detail later. If a driving signal is provided to a particular driving electrode 18b from the flexible printed board 19, the piezoelectric unit structure 18a corresponding to the particular driving electrode 18b applies pressure to the corresponding ink pressure chamber 17a so that ink is ejected from the corresponding nozzle 9a.

The flexible printed board 19 includes a base film 19a such as a polyimide film, a plurality of conductive patterns 19b made of copper foil and bonded to the top face of the base film 19a, and a resist layer (insulation layer) 19d covering the top face of the base film 19a and the conductive patterns 19b. A through hole 19c is formed to the base film 19a at an end portion of each conductive pattern 19b. The end portion of each conductive pattern 19b extends through the corresponding through hole 19c to be connected with an electrode land 19e formed at the lower end of the through hole (on under surface of the base film 19a).

Next, the connection between the piezoelectric actuators 18 and the flexible printed board 19 will be described.

The driving electrode 18b is provided, on a portion of the top face thereof, with a contact layer 18c including iron powder that is not magnetized. The contact layer 18c is obtained by applying an adhesive agent containing iron powder on the driving electrode 18b, for example, by means of silkscreen printing and then curing the adhesive agent at temperatures from 80° C. to 150° C.

The electrode land 19e is provide with a contact layer 19f that includes a permanent magnet powder. The contact layer 19f is obtained by applying an adhesive agent including the permanent magnet powder on the electrode land 19e, for example, by means of silkscreen printing and then curing the adhesive agent at temperatures from 80° C. to 150° C.

It should be noted, that the contact layers 18c and 19f possess electrical conductivity since iron powder and permanent magnet powder, which also exhibit conductivity, are mixed into the respective contact layers. In addition, the contact layers 18c and 19f are attracted to each other and thereby establish a connection with each other by means of the magnetic force acting between the permanent magnet powder and the iron powder. When a connection between the contact layers 18c and 19e is established, the electrode land 19e and the driving electrode 18b are electrically connected to each other via the contact layers 19f and 18c. As a result, driving voltage can be applied to the piezoelectric unit structure 18a from the conductive pattern 19b of the flexible printed board 19 through the electrode land 19e, the contact layer 19f including the permanent magnet powder, the contact layer 18c including the iron powder, and the driving electrode 18b.

In the meanwhile, the ink pressure chambers 17a of the head body 8 are supplied with ink from an external ink supplying source (not shown) through the ink supply channels (30), the manifolds MN, the through holes 14b, the ink flow restricting channels 15b, and the through holes 16b. When the driving voltage is applied to a particular piezoelectric unit structure 18a from the flexible printed board 19, the particular piezoelectric unit structure 18a deforms so as to apply pressure to the ink in the corresponding ink pressure chamber 17a. As a result, ink is ejected from the nozzle 9a, that is in fluid communication with the ink pressure chamber 17a through the through holes 16a, 15a, 14a, 13a, 12a, 11a, and 10a, to print on a recording medium.

Ink ejecting test of the inkjet head 1 configured as above is carried out by connecting the inkjet head 1 with the flexible printed board 19 at the contact layers 18c and 19f. If any defect is found in the inkjet head 1 such as clogging of the nozzles, the flexible printed board 19 is detached from the inkjet head 1 to allow reuse of the flexible printed board 19. Alternatively, if any defect is found in the flexible printed board 19, the flexible printed board 19 is detached from the inkjet head 1 to allow reuse of the inkjet head 1.

It should be noted that the flexible printed board 19 can be detached from the inkjet head 1 without any difficulties since the connection between the inkjet head 1 and the flexible printed board 19 is established only by the magnetic force acting between the contact layers 18c and 19f.

While the invention has been described in detail with reference to specific embodiments thereof, it would be apparent to those skilled in the art that various changes and modifications may be made therein without departing from the spirit of the invention.

For example, the flexible printed board 19 may be replaced with other kinds of printed boards.

Further, both of the contact layers 18c and 19f may be made of an adhesive agent including powder of magnetic material and then magnetized so as to have different magnetic poles at their faces to be connected to each other.

Figure 5:
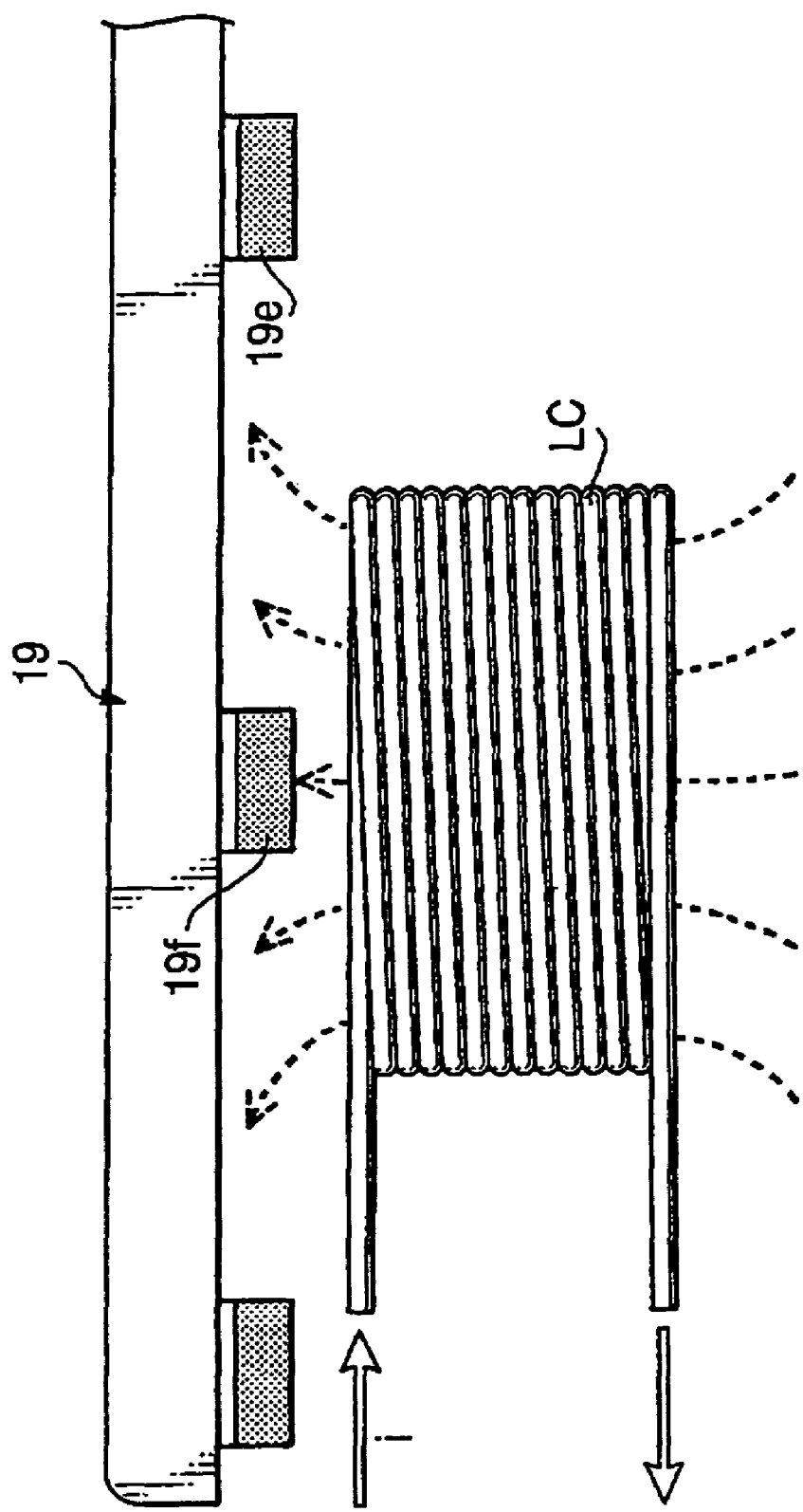
FIG. 5 shows an exemplary method for magnetizing contact layers on the flexible printed board of the inkjet head system shown in FIG. 1.

FIG. 5 shows an exemplary method for magnetizing the contact layer 19f of the flexible printed board 19. As shown in FIG. 5, the tip portion of the flexible printed board 19 is located in a vicinity of a magnetizing coil LC. Then, current is passed through the magnetizing coil LC so as to magnetize the contact layer(s) 19f formed on the flexible printed board 19. The direction of the current is determined such that the side of each contact layer 19f to be connected with the contact layer 18c on the inkjet head 1 to one of the N and S poles.

In an analogous fashion, each driving electrode 18b of the piezoelectric actuator 18 is also placed near the magnetizing coil LC. Then, current is passed through the magnetizing coil LC in a direction that allows the magnetizing coil LC to magnetize the side of the contact layer 18c to be connected with the contact layer 19f on the flexible printed board 19 to the other one of N and S poles.

The contact layers 18c and 19f prepared as above also attract and establish connection between each other by the magnetic force acting therebetween, and thereby allow the conductive patterns 19b of the flexible printed board 19 to be electrically connected with the respective ones of the driving electrodes 18b on the piezoelectric actuator 18.

The present disclosure relates to the subject matter contained in Japanese Patent Application No. P2002-277331, filed on Sep. 24, 2002, which is expressly incorporated herein by reference in its entirety.

What is claimed is:

1. An inkjet head system having an inkjet head and a printed board connected to the inkjet head, wherein said inkjet head comprises:
   a cavity plate formed with a plurality of ink pressure chambers arranged adjacent to each other;
   a piezoelectric actuator placed on said cavity plate; and
   a plurality of electrodes formed on said piezoelectric actuator at positions corresponding to respective ones of said plurality of ink pressure chambers, and said printed board comprises a plurality of electrode lands connected with respective ones of said plurality of driving electrodes to supply driving signals thereto, said electrode lands and corresponding ones of said plurality of driving electrodes being attracted with each other with magnetic force acting to cause the connection between the respective electrode lands and driving electrodes.

2. The inkjet head system according to claim 1, wherein said electrode lands and said driving electrodes are respectively provided with first and second conductive layers thereon, and one of said first and second conductive layers includes permanently magnetized magnetic material, and the other one of said first and second conductive layers includes magnetic material that is not magnetized.

3. The inkjet head system according to claim 2, wherein said one of said first and second conductive layers includes powder of permanent magnet.

4. The inkjet head system according to claim 3, wherein said other one of said first and second conductive layers includes powder of iron.

5. The inkjet head system according to claim 1, wherein said electrode lands and said driving electrodes are respectively provided with first and second conductive layers thereon, and each of said first and second conductive layers includes permanently magnetized magnetic material.

6. The inkjet head system according to claim 2, wherein each of said first and second conductive layers is made of thermosetting resin that includes magnetic material.

7. The inkjet head system according to claim 2, wherein each of said first and second conductive layers is made of an adhesive agent that includes magnetic material.

8. An inkjet head, comprising:
   a terminal to be connected with an external power line to receive power for driving said inkjet head, said terminal being provided with magnetic material, said magnetic material allowing said terminal being detachably connected with the external power line by means of magnetic force.

9. The inkjet head according to claim 8, wherein said magnetic material is permanently magnetized.

10. The inkjet head according to claim 8, wherein said magnetic material is ferromagnetic material that is not magnetized.

11. The inkjet head system according to claim 10, wherein said magnetic material is iron.

12. The inkjet head according to claim 8, wherein said magnetic material is provided on said terminal by forming a layer of thermosetting resin that includes said magnetic material.

13. The inkjet head according to claim 12, wherein said magnetic material is mixed into said resin in a form of powder.

14. The inkjet head according to claim 8, wherein said magnetic material is provided on said terminal by forming a layer of an adhesive agent that includes said magnetic material.

15. A flexible printed board for use in combination with an inkjet head having terminals including magnetic material, said flexible printed board comprising:
   an electrode land to be connected with the terminal of the inkjet head to provide power thereto; and
   a conductive layer formed on said electrode land, said conductive layer including magnetic material, said conductive layer and the terminal of the inkjet head attract and establish connection with each other due to a magnetic force acting therebetween.

16. The flexible printed board according to claim 15, wherein said magnetic material is permanently magnetized.

17. The flexible printed board according to claim 15, wherein said magnetic material is ferromagnetic material not magnetized.

18. The flexible printed board according to claim 15, wherein said conductive layer is made of thermosetting resin including said magnetic material.

19. The flexible printed board according to claim 18, wherein said magnetic material is mixed into said thermosetting resin in a form of powder.

20. The flexible printed board according to claim 15, wherein said conductive layer is made of an adhesive agent including said magnetic material.

* * * * *